(12) United States Patent  
Tain et al.

(10) Patent No.: US 8,536,701 B2
(45) Date of Patent: Sep. 17, 2013

(54) ELECTRONIC DEVICE PACKAGING STRUCTURE

(75) Inventors: Ra-Min Tain, New Taipei (TW); Ming-Ji Dai, Hsinchu (TW); John H. Lau, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/411,639

(22) Filed: Mar. 5, 2012

(65) Prior Publication Data

US 2012/0280385 A1    Nov. 8, 2012

Related U.S. Application Data

(60) Provisional application No. 61/481,750, filed on May 3, 2011.

(30) Foreign Application Priority Data

Dec. 19, 2011  (TW) ............................. 100147205 A

(51) Int. Cl.
  *H01L 23/48*  (2006.01)
  *H01L 29/40*  (2006.01)
(52) U.S. Cl.
  USPC ........... 257/737; 257/276; 257/557; 257/565; 257/621; 257/698; 438/205; 438/316; 438/667
(58) Field of Classification Search
  USPC ................. 257/737, 698, 621, 565, 557, 276, 257/E23.021; 438/205, 316, 667
  See application file for complete search history.

(56) References Cited

U.S. PATENT DOCUMENTS

| 5,426,072 | A  | * | 6/1995 | Finnila .......................... 438/107 |
| 7,531,876 | B2 |   | 5/2009 | Omura et al. |
| 7,569,920 | B2 |   | 8/2009 | Otremba et al. |
| 7,576,410 | B2 |   | 8/2009 | Rueb et al. |
| 7,936,048 | B2 |   | 5/2011 | Otremba |
| 8,018,031 | B2 | * | 9/2011 | Yanagida ....................... 257/621 |
| 2010/0032810 | A1 |   | 2/2010 | Ding et al. |

OTHER PUBLICATIONS

Abdus Sattar, "Insulated Gate Bipolar Transistor (IGBT) Basics", IXYS Corporation, http://www.ixys.com/SearchResults.aspx?search=Insulated+Gate+Bipolar+Transistor+%28IGBT%29+Basics&SearchSubmit=GO, retrieved on Mar. 5, 2012, pp. 1-15.
Saito et al., "High-Voltage GaN-HEMTs for Power Electronics Applications and Current Collapse Phenomena , under High Applied Voltage", CS MANTECH Conference, May 14-17, 2007, pp. 209-212.

(Continued)

*Primary Examiner* — Theresa T Doan
(74) *Attorney, Agent, or Firm* — Jianq Chyun IP Office

(57) ABSTRACT

An electronic device packaging structure is provided. The semiconductor device includes a semiconductor base, an emitter, a collector, and a gate. The emitter and the gate are disposed on a first surface of the semiconductor base. The collector is disposed on a second surface of the semiconductor base. A first passivation layer is located on the first surface of the semiconductor base surrounding the gate. A first conductive pad is disposed on the first passivation layer. A second conductive pad is disposed on the collector on the second surface. At least one conductive through via structure penetrates the first passivation layer, the first and second surfaces of the semiconductor base, and the collector to electrically connect the first and second conductive pads.

12 Claims, 4 Drawing Sheets

(56) References Cited

OTHER PUBLICATIONS

Kao et al., "2.5-Ampere AlGaN/GaN HFETs on Si Substrates with Breakdown Voltage > 1,250V", CS MANTECH Conference, May 16-19, 2011, pp. 1-4.

Hikita et al., "AlGaN/GaN Power HFET on Silicon Substrate With Source-Via Grounding (SVG) Structure", IEEE Transactions on Electron Devices, Sep. 2005, pp. 1963-1968, vol. 52, No. 9.

Saito et al., "High Voltage and High Switching Frequency Power-Supplies using a GaN-HEMT", IEEE Compound Semiconductor Integrated Circuit Symposium, 2006, pp. 253-256.

Quay et al., "AlGaN/GaN HEMTs on Sic: Towards Power Operation at V-Band" IEEE Electron Devices Meeting, 2003, pp. 23.2.1-23.2.4.

Ikeda et al., "High-power AlGaN/GaN HFETs on Si substrates for power-switching applications", Gallium Nitride Materials and Devices IV, 2009, pp. 721602-1-721602-11.

\* cited by examiner

ELECTRONIC DEVICE PACKAGING STRUCTURE

CROSS-REFERENCE TO RELATED APPLICATION

This application claims the priority benefits of U.S. provisional application Ser. No. 61/481,750, filed on May 3, 2011 and Taiwan application serial no. 100147205, filed on Dec. 19, 2011. The entirety of each of the above-mentioned patent applications is hereby incorporated by reference herein and made a part of this specification.

TECHNICAL FIELD

The disclosure relates to an integrated circuit, and particularly relates to an electronic device packaging structure.

BACKGROUND

Conventional power devices have upper and bottom electrodes respectively disposed on two surfaces of a chip. Due to the high power consumption of power chips, especially those applied in electric vehicles that consume thousands of watts, heat dissipation of the power chips has been a great challenge. Power modules used nowadays are still power devices with the structure having the upper and bottom electrodes. Such a structure requires wire-bonding and soldering to package the power module, which needs a more complicated process of fabrication and high costs for packaging equipment.

SUMMARY

The disclosure provides an electronic device packaging structure, including a semiconductor device, a first passivation layer, a first conductive pad, a second conductive pad, and at least one conductive through via structure. The semiconductor device includes a semiconductor base, a first conductivity type body region, a second conductivity type doped region, a first dielectric layer, a second dielectric layer, an emitter, a collector, and a gate. The semiconductor base has a first surface and a second surface, wherein the first surface is opposite to the second surface. The collector is disposed on the second surface of the semiconductor base. The first conductivity type body region is disposed on the first surface of the semiconductor base. The second conductivity type doped region is disposed in the first conductivity type body region. The gate is disposed on the first surface of the semiconductor base and covers a portion of the first conductivity type body region and a portion of the second conductivity type doped region. In addition, the gate is isolated from the first surface of the semiconductor base, the first conductivity type body region, and the second conductivity type doped region by the first dielectric layer. The second dielectric layer covers the gate. The second dielectric layer has an opening that penetrates the second conductivity type doped region and extends to the bottom of the opening to expose the first conductivity type body region. The emitter is disposed on the second dielectric layer of the semiconductor base, fills the opening, and is electrically connected to the second conductivity type doped region and the first conductivity type body region. The first passivation layer is disposed on the first surface of the semiconductor base surrounding the gate. The first conductive pad is disposed on the first passivation layer. The second conductive pad is disposed on the collector on the second surface of the semiconductor base. The conductive through via structure penetrates the first passivation layer, the first surface and the second surface of the semiconductor base, and the collector. Besides, the conductive through via structure includes a conductive pillar and a second passivation layer. The conductive pillar is disposed in the semiconductor base and the collector and electrically connected to the first conductive pad and the second conductive pad. The second passivation is disposed between the conductive pillar and the semiconductor base and the collector.

The disclosure also provides an electronic device packaging structure, including a semiconductor device, a passivation layer, and a conductive pad. The semiconductor device includes a semiconductor base, a first conductivity type body region, a second conductivity type doped region, a first dielectric layer, a second dielectric layer, an emitter, a collector, and a gate. A first surface of the semiconductor base includes a first region, a second region, and a third region, wherein the third region is disposed between the first region and the second region. The collector is disposed on the second region of the semiconductor base. The first conductivity type body region is disposed on the first surface of the semiconductor base. The second conductivity type doped region is disposed in the first conductivity type body region. The gate is disposed over the first region of the semiconductor base and covers a portion of the first conductivity type body region and a portion of the second conductivity type doped region. The gate is isolated from the first surface of the semiconductor base, the first conductivity type body region, and the second conductivity type doped region by the first dielectric layer. The second dielectric layer covers the gate and has an opening penetrating the second conductivity type doped region and extending to the bottom of the opening to expose the first conductivity type body region. The emitter is disposed on the second dielectric layer over the semiconductor base, fills the opening, and is electrically connected to the second conductivity type doped region and the first conductivity type body region. The passivation layer is disposed on the third region. The conductive pad is disposed on the collector.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
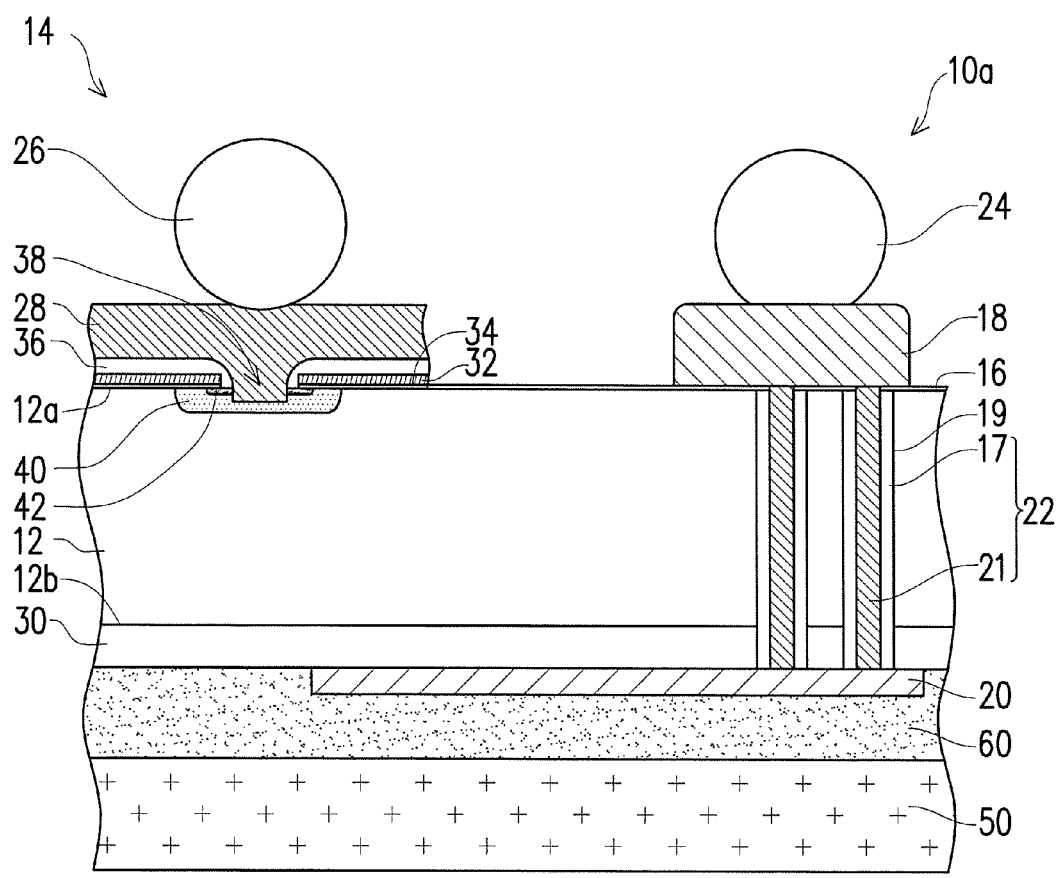
FIG. 1 is a schematic cross-sectional view illustrating an electronic device packaging structure according to a first embodiment of the disclosure.

FIG. 1 is a schematic cross-sectional view illustrating an electronic device packaging structure according to the first embodiment of the disclosure.

As shown in FIG. 1, an electronic device packaging structure 10a includes a semiconductor device 14, a first passivation layer 16, a first conductive pad 18, a second conductive pad 20, at least one conductive through via structure 22, a first bump 24, and a second bump 26.

The semiconductor device 14 includes a semiconductor base 12, an emitter 28, a collector 30, and a gate 32. The semiconductor base 12 has a first surface 12a and a second surface 12b, wherein the first surface 12a is opposite to the second surface 12b. The semiconductor base 12 may be made of IV-group elements, IV-IV group semiconductor compounds, or III-V group semiconductor compounds. The semiconductor base 12 may be made of, for example, silicon, GaN, or SiC. The semiconductor base 12 is, for example, second conductivity type doped epitaxial silicon. The emitter 28 is disposed on the first surface 12a of the semiconductor base 12. The collector 30 is disposed on the second surface 12b of the semiconductor base 12.

The gate 32 is located on the first surface 12a of the semiconductor base 12 and between the semiconductor base 12 and the emitter 28. Besides, the gate 32 is isolated from the first surface 12a of the semiconductor base 12 by the first dielectric layer 34 and isolated from the emitter 28 by the second dielectric layer 36. The first dielectric layer 34 is, for instance, silicon dioxide ($SiO_2$), silicon nitride ($Si_3N_4$), or aluminum nitride (AlN). A thickness of the first dielectric layer 34 is, for example, approximately 5000 Å to 20000 Å. A material of the second dielectric layer 36 may be the same as or different from a material of the first dielectric layer 34, and the material of the second dielectric layer 36 is, for instance, $SiO_2$, $Si_3N_4$, or AlN. A thickness of the second dielectric layer 36 is, for example, approximately 5000 Å to 20000 Å.

A material of the emitter 28 may be metal, such as aluminum, copper, or gold. A material of the collector 30 is, for example, first conductivity type doped epitaxial silicon. A material of the gate 32 is, for example, second conductivity type doped polysilicon. In an embodiment, the first/second conductivity type in the embodiment described herein is, for example, p-type/n-type. In another embodiment, the first/second conductivity type in the embodiment described herein is, for example, n-type/p-type. A p-type dopant is, for example, phosphorus, arsenic, or stibium. An n-type dopant is, for example, boron, indium, or gallium.

In an embodiment, the semiconductor device 14 further includes a first conductivity type body region 40 and a second conductivity type doped region 42. The first conductivity type body region 40 is disposed in the first surface 12a of the semiconductor base 12. The gate 32 covers a portion of the first conductivity type body region 40 and a portion of the second conductivity type doped region 42. In addition, the gate 32 is isolated from the first surface 12a of the semiconductor base 12, the first conductivity type body region 40, and the second conductivity type doped region 42 by the first dielectric layer 34. In addition, the semiconductor device 14 has an opening 38, and the opening 38 is disposed in the second dielectric layer 36, penetrates the second conductivity type doped region 42, and extends to the bottom of the opening 38 to expose the first conductivity type body region 40. A depth of the opening 38 is, for example, approximately 20000 Å to 40000 Å.

The first dielectric layer 34, the gate 32, and the second dielectric layer 36 are disposed, in turn, on the first conductivity type body region 40, the second conductivity type doped region 42, and the first surface 12a of the semiconductor base 12. The opening 38 is disposed in the first conductivity type body region 40, the second conductivity type doped region 42, and the second dielectric layer 36, such that the emitter 28 may be arranged in a T-shaped manner and formed in the opening 38 in order for the emitter 28 to directly contact the first conductivity type body region 40 at the bottom of the opening 38, the second conductivity type doped region 42 at the side wall of the opening 38, and the second dielectric layer 36, respectively.

The first passivation layer 16 is disposed on the first surface 12a of the semiconductor base 12 surrounding the gate 32, and is connected to the first dielectric layer 34. A material of the first passivation layer 16 may be a dielectric material, such as $SiO_2$, $Si_3N_4$, or AlN. A thickness of the first passivation layer 16 is, for example, between approximately 5000 Å and 20000 Å.

The first conductive pad 18 is disposed on the first passivation layer 16 over the first surface 12a of the first semiconductor base 12. The first conductive pad 18 includes an under bump metallurgic (UBM) layer, which is made of, for example, nickel or gold. The second conductive pad 20 is disposed on the collector 30 of the second surface 12b of the semiconductor base 12. A material of the second conductive pad 20 includes metal or a metallic alloy, such as copper or aluminum.

The conductive through via structure 22 is disposed in a conductive through via 19 penetrating the first passivation layer 16, the first surface 12a and the second surface 12b of the semiconductor base 12, and the collector 30. The conductive through via structure 22 includes a conductive pillar 21 and a second passivation layer 17. The conductive pillar 21 penetrates the first passivation layer 16 and is respectively electrically connected to the first conductive pad 18 and the second conductive pad 20. A material of the conductive pillar 21 includes metal or a metallic alloy, such as copper, tungsten, aluminum, or an alloy thereof. The number of the conductive through via structure 22 and the conductive through via 19 may be one or more. There are two conductive through via structures 22 and two conductive through vias 19 in the drawing, but the number of the two elements in the embodiment described herein should not be construed as a limitation of the disclosure. The second passivation layer 17 is disposed between the conductive pillar 21 and the semiconductor base 12 A material of the second passivation layer 17 may be the same as or different from the material of the first passivation layer 16. The material of the second passivation layer may be a dielectric material, such as $SiO_2$, $Si_3N_4$, or AlN. A thickness of the second passivation layer 17 is, for example, between approximately 5000 Å and 20000 Å.

The first bump 24 is disposed on the first conductive pad 18 and is electrically connected to the first conductive pad 18. The second bump 26 is disposed on the emitter 28 and is electrically connected to the emitter 28. A material of the first bump 24 and the second bump 26 may be metal or a metallic alloy, such as a gold bump, a solder bump, or a copper bump.

The electronic device packaging structure 10a described above may further include a heatsink 50. The heatsink 50 may be disposed at one side of an electrode 20. A material of the heatsink 50 may be a metallic or insulating material. If the material of the heatsink 50 is a metallic material, the electrode 20 and the heatsink 50 may be attached to each other through a thermally conductive adhesive 60, which is dielectric. If the heatsink 50 is made of an insulating material, such as a ceramic material or an organic material with high heat-dissipating capacity, the heatsink 50 may directly contact the electrode 20.

Figure 2:
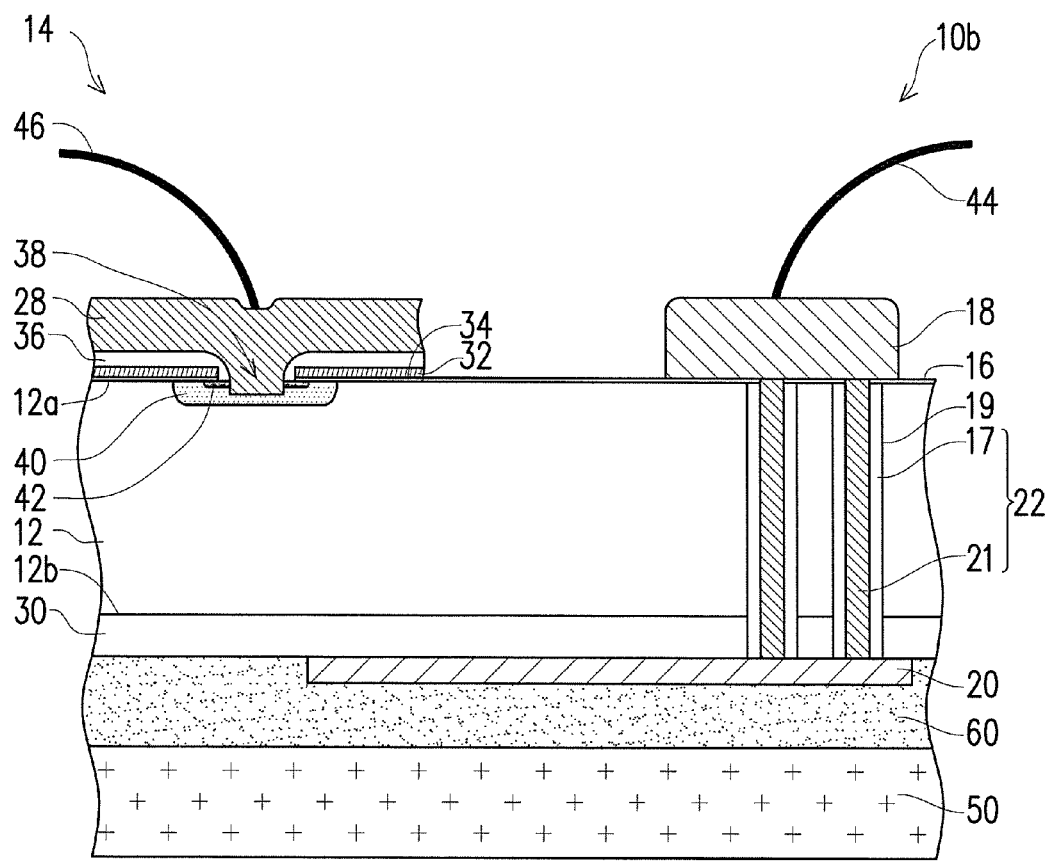
FIG. 2 is a schematic cross-sectional view illustrating an electronic device packaging structure according to a second embodiment of the disclosure.

FIG. 2 is a schematic cross-sectional view illustrating an electronic device packaging structure according to the second embodiment of the disclosure.

As shown in FIG. 2, components of an electronic device packaging structure 10b of the embodiment is very similar to the components of the electronic device packaging structure 10a described above. The electronic device packaging structure 10b also include the semiconductor device 14, the first passivation layer 16, the second passivation layer 17, the first conductive pad 18, the second conductive pad 20, and at least one conductive through via structure 22. In addition, the electronic device packaging structure 10b may further include the heatsink 50 as well. The electronic device packaging structure 10b differs from the electronic device packaging structure 10a in that a first conductive bond wire 44 and a second conductive bond wire 46 are used to replace the first bump 24 and the second bump 26, respectively. The first conductive bond wire 44 is electrically connected to the first conductive pad 18. The second conductive bond wire 46 is electrically connected to the emitter 28. A material of the first conductive bond wire 44 and the second conductive bond wire 46 includes metal or an alloy, such as gold, aluminum, or copper.

Figure 3:
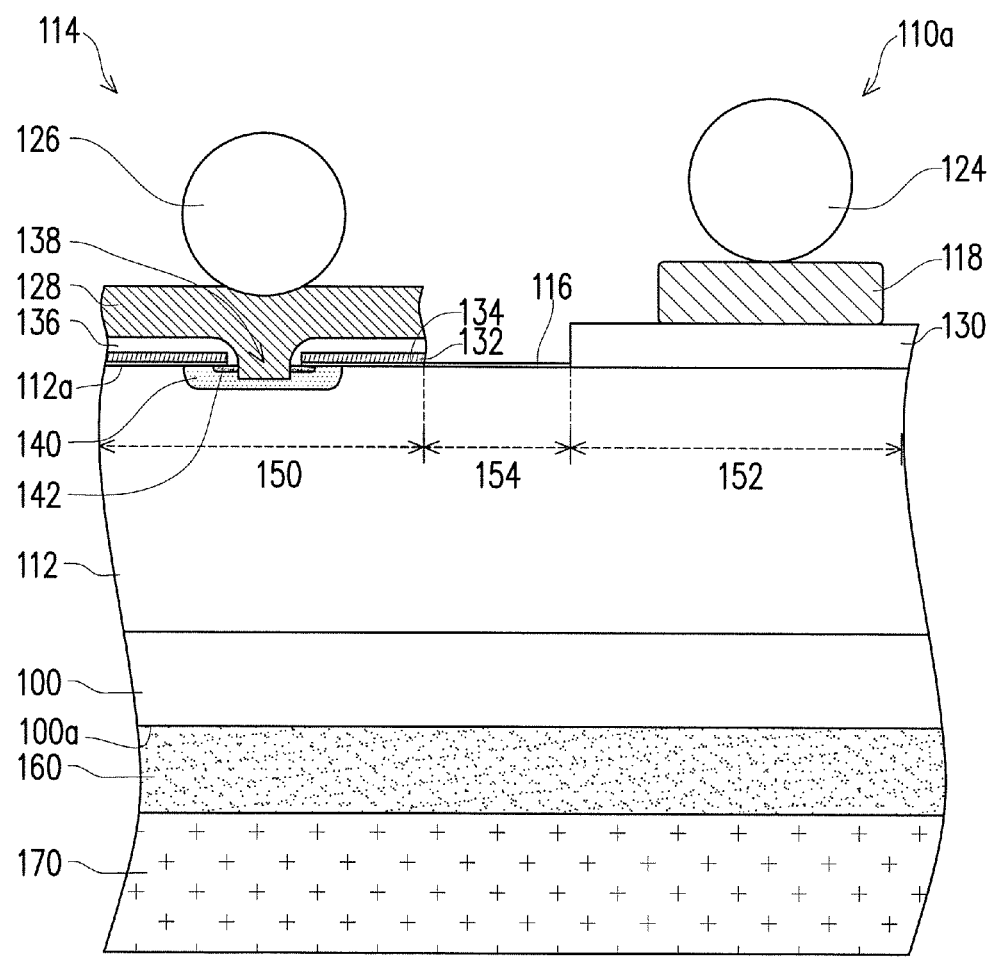
FIG. 3 is a schematic cross-sectional view illustrating an electronic device packaging structure according to a third embodiment of the disclosure.

FIG. 3 is a schematic cross-sectional view illustrating an electronic device packaging structure according to the third embodiment of the disclosure.

As shown in FIG. 3, an electronic device packaging structure 110a is provided in the disclosure, and the electronic device packaging structure 110a includes a semiconductor device 114, a passivation layer 116, a conductive pad 118, a first bump 124, and a second bump 126.

The semiconductor device 114 includes a semiconductor base 112, an emitter 128, a collector 130, and a gate 132. The semiconductor base 112 is disposed on a substrate 100. The substrate 100 is, for example, a silicon wafer. A first surface 112a of the semiconductor base 112 includes a first region 150, a second region 152, and a third region 154, wherein the third region 154 is disposed between the first region 150 and the second region 152. The emitter 128 is disposed on the first region 150 of the first surface 112a of the semiconductor base 112. The collector 130 is disposed on the second region 152 of the first surface 112a of the semiconductor base 112. The gate 132 is disposed on the first region 150 of the first surface 112a of the semiconductor base 112. The gate 132 is isolated from the first surface 112a of the semiconductor base 112 by a first dielectric layer 134, whereas the gate 132 is isolated from the emitter 128 by a second dielectric layer 136.

In an embodiment, the semiconductor device 114 further includes a first conductivity type body region 140 and a second conductivity type doped region 142. The first conductivity type body region 140 is disposed in the first region 150 of the first surface 112a of the semiconductor base 112. The gate 132 covers a portion of the first conductivity type body region 140 and a portion of the second conductivity type doped region 142. In addition, the gate 132 is isolated from the first surface 112a of the semiconductor base 112, the first conductivity type body region 140, and the second conductivity type doped region 142 by the first dielectric layer 134. Moreover, the semiconductor device 114 also has an opening 138. The opening 138 is disposed in the second dielectric layer 136, penetrates the second conductivity type doped region 142, and extends to the bottom of the opening 138 to expose the first conductivity type body region 140. A thickness of the opening 138 is, for example, between approximately 20000 Å and 40000 Å.

Namely, the first dielectric layer 134, the gate 132, and the second dielectric layer 136 are disposed, in turn, on the first conductivity type body region 140, the second conductivity type doped region 142, and the first surface 112a of the semiconductor base 112. The opening 138 is disposed in the first conductivity type body region 140, the second conductivity type doped region 142, and the second dielectric layer 136, such that the emitter 128 may be arranged in a T-shaped manner and formed in the opening 138 in order for the emitter 128 to directly contact the first conductivity type body region 140, the second conductivity type doped region 142, and the second dielectric layer 136.

The passivation layer 116 is disposed on the third region 154 of the first surface 112a, and is connected to the first dielectric layer 134. A material of the passivation layer 116 includes $SiO_2$, $Si_3N_4$, or AlN.

The conductive pad 118 is disposed on the collector 130. The conductive pad 118 includes a layer of under bump metallization (UBM), which is made of, for example, nickel, gold, or an alloy thereof.

The first bump 124 is disposed on and is electrically connected to the conductive pad 118. The second bump 126 is disposed on and is electrically connected to the emitter 128.

The semiconductor base 112, the emitter 128, the collector 130, the gate 132, the passivation layer 116, the conductive pad 118, the first bump 124, and the second bump 126 of the semiconductor device 114 in the embodiment described herein may be made of the same materials as those of the semiconductor base 12, the emitter 28, the collector 30, the gate 32, the passivation layer 16, the conductive pad 18, the first bump 24, and the second bump 26 of the semiconductor device 14 in the embodiment described above, so the details are not iterated any further.

Moreover, the electronic device packaging structure 110a described above may further include a heatsink 170. The heatsink 170 may be disposed on a surface 100a of the substrate 100. If a material of the heatsink 170 is metallic, the substrate 100 and the heatsink 170 may be connected to each other through a thermally conductive adhesive 160, which is dielectric. If the material of the heatsink 170 is an insulating material, the heatsink 170 may directly contact the surface 100a of the substrate 100.

Figure 4:
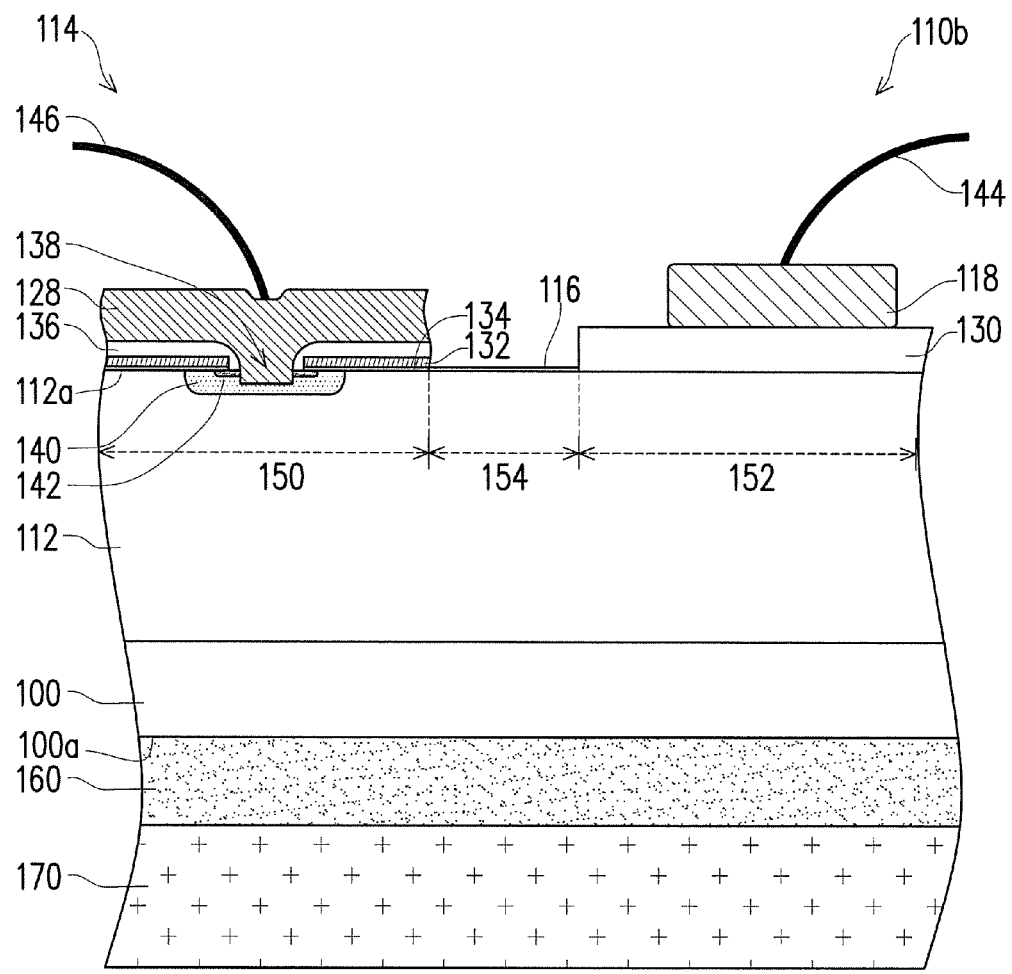
FIG. 4 is a schematic cross-sectional view illustrating an electronic device packaging structure according to a fourth embodiment of the disclosure.

FIG. 4 is a schematic cross-sectional view illustrating an electronic device packaging structure according to the fourth embodiment of the disclosure.

As shown in FIG. 4, the components included in the electronic device packaging structure 110b of the fourth embodiment is very similar to the electronic device packaging structure 110a of the third embodiment described above. The electronic device packaging structure 110b also includes the semiconductor device 114, the passivation layer 116, and the conductive pad 118. The electronic device packaging structure 110b may further include the heatsink 170. The electronic device packaging structure 110b differs from the electronic device packaging structure 110a in that the first conductive bond wire 144 and the second conductive bond wire 146 are used to replace the first bump 124 and the second bump 126, respectively. The first conductive bond wire 144 is electrically connected to the conductive pad 118. The second conductive bond wire 146 is electrically connected to the emitter 128. A material of the first conductive bond wire 144 and the second conductive bond wire 146 is, for example, gold, aluminum, or copper.

The disclosure described herein provides an electronic device packaging structure which can be packaged in a simple manner and has a large area for heat dissipation, thereby improving heat dissipating efficiency and reliability. Based on the above, the electronic device packaging structure provided in the disclosure is able to be packaged through wire-bonding or soldering. In addition, the electronic device packaging structure provided in the disclosure has a large heat-dissipating area to improve the heat-dissipating efficiency as well as the reliability.

The disclosure modifies the conventional way to package upper and bottom electrodes. By using the conductive through via structure that penetrates the two surfaces of the semiconductor base or disposing the electrodes of the semiconductor device on the same side of the chip, the power chip can be disposed on the substrate by flip chip. The other side of the chip, on which the electrodes are not disposed, can be attached to the heatsink to allow thermal dissipation to a greater extent. The conventional power module is packaged at the top of the chip by wire bonding and sealed by silica gel, so that heat is dissipated through the bottom surface of the substrate; by contrast, the structure disclosed herein has a larger heat dissipating area, which improves reliability of the chip.

Although the disclosure has been disclosed above by the embodiments, they are not intended to limit the disclosure. Persons skilled in the art may make some modifications and variations without departing from the spirit and scope of the disclosure. Therefore, the protecting range of the disclosure falls in the appended claims.

What is claimed is:

1. An electronic device packaging structure, comprising:
    a semiconductor device, comprising:
        a semiconductor base, comprising a first surface and a second surface, wherein the first surface is opposite to the second surface;
        a collector, disposed on the second surface of the semiconductor base;
        a first conductivity type body region, disposed in the first surface of the semiconductor base;
        a second conductivity type doped region, disposed in the first conductivity type base region;
        a gate, disposed on the first surface of the semiconductor base, covering a portion of the first conductivity type body region, and a portion of the second conductivity type doped region, the gate being isolated from the first surface of the semiconductor base, the first conductivity type body region, and the second conductivity type doped region by a first dielectric layer;
        a second dielectric layer, covering the gate and having an opening, wherein the opening penetrates the second conductivity type doped region and extends to a bottom of the opening to expose the first conductivity type body region; and
        an emitter, disposed on the second dielectric layer over the semiconductor base and filling the opening, the emitter being electrically connected to the second conductivity type doped region and the first conductivity type body region;
    a first passivation layer, disposed on the first surface of the semiconductor base surrounding the gate and connected to the first dielectric layer;
    a first conductive pad, disposed on the first passivation layer;
    a second conductive pad, disposed on the collector on the second surface of the semiconductor base; and
    at least one conductive through via structure, penetrating the first passivation layer, the first surface and the second surface of the semiconductor base, and the collector, and electrically comected to the first conductive pad and the second conductive pad, wherein the conductive through via structure comprises:
        a conductive pillar, disposed in the semiconductor base and the collector; and
        a second passivation layer, disposed between the conductive pillar and the semiconductor base and the collector.

2. The electronic device packaging structure as claimed in claim 1, further comprising:
    a first bump, electrically connected to the first conductive pad; and
    a second bump, electrically connected to the emitter.

3. The electronic device packaging structure as claimed in claim 2, wherein the first conductive pad comprises a layer of under bump metallization.

4. The electronic device packaging structure as claimed in claim 3, wherein a material of the first conductive pad comprises nickel, gold, oran alloy thereof.

5. The electronic device packaging structure as claimed in claim 1, wherein a material of the second conductive pad comprises metal or a metallic alloy.

6. The electronic device packaging structure as claimed in claim 1, wherein a material of the second conductive pad comprises copper, aluminum, or an alloy thereof.

7. The electronic device packaging structure as claimed in claim 1, further comprising:
    a first conductive bond wire, electrically connected to the first conductive pad; and
    a second conductive bond wire, electrically connected to the emitter.

8. The electronic device packaging structure as claimed inclaim 1, wherein a material of the conductive pillar comprises metal or a metallic alloy.

9. The electronic device packaging structure as claimed in claim 1, wherein a material of the conductive pillar comprises copper, tungsten, aluminum, or an alloy thereof.

10. The electronic device packaging structure as claimed in claim 1, wherein a material of the first passivation layer comprises silicon dioxide, silicon nitride or aluminum nitride.

11. The electronic device packaging structure as claimed in claim 1, wherein a material of the second passivation layer comprises silicon dioxide, silicon nitride or aluminum nitride.

12. The electronic device packaging structure as claimed in claim 1, wherein the first conductivity type body region comprises a p-type body region, while the second conductivity type doped region comprises an n-type doped region, or the first conductivity type body region comprises an n-type body region, while the second conductivity type doped region comprises a p-type doped region.

* * * * *